United States Patent [19]

Peuzin

[11] Patent Number: 4,493,563
[45] Date of Patent: Jan. 15, 1985

[54] PYROELECTRIC DETECTOR

[75] Inventor: Jean C. Peuzin, Eybens, France

[73] Assignee: Commissariat a l'Energie Atomique, Paris, France

[21] Appl. No.: 354,246

[22] Filed: Mar. 3, 1982

[30] Foreign Application Priority Data

Mar. 13, 1981 [FR] France ............................ 81 05059

[51] Int. Cl.³ ............................ G01J 5/02; G01J 5/10; G01J 5/48; G01K 7/32
[52] U.S. Cl. ................................ 374/121; 156/600; 250/338; 356/43
[58] Field of Search ........ 156/600; 374/121, 176–178; 356/43; 250/338

[56] References Cited

U.S. PATENT DOCUMENTS

| 3,448,348 | 6/1969 | Stadler | 374/177 |
| 3,480,777 | 11/1969 | Astheimer | 374/121 |
| 3,809,920 | 5/1974 | Cohen et al. | 374/121 |
| 3,940,974 | 3/1976 | Taylor | 374/177 |

FOREIGN PATENT DOCUMENTS

| 1375780 | 11/1974 | United Kingdom | 374/121 |
| 365594 | 7/1973 | U.S.S.R. | 374/121 |

OTHER PUBLICATIONS

Newnhan et al., "Ferroelectric Ceramic–Plastic Composites for Piezoelectric and Pyroelectric Applications", Ferroelectrics, vol. 27, pp. 49–55, 1980.
Cooper, "A Fast-Response Pyroelectric Detector", J. Sci. Instrum., vol. 39, 1962.
Beerman, "Pyroelectric Infrared Radiation Detector", Am. Cer. Soc. Bull., vol. 46, No. 8, 1967.

Primary Examiner—Bradley Garris

[57] ABSTRACT

A pyroelectric detector with an optimized quality factor, having a dielectric material inserted between two parallel electrodes, the material being a monodomain ferroelectric monocrystal. The faces of the monocrystal in contact with the electrodes form an angle differing from 90° with the polar axis of the monocrystal. The detector is useful in infrared imaging and detection.

6 Claims, 3 Drawing Figures

PYROELECTRIC DETECTOR

BACKGROUND OF THE INVENTION

The invention relates to a pyroelectric detector with an optimized quality, efficiency or merit factor. It is applicable to the field of pyroelectric detection and more particularly to that of infrared imaging and detection. These processes use generally monocrystalline dielectric materials having a highly temperature-dependent spontaneous polarization. This property essentially occurs in so-called ferroelectric dielectric materials.

Generally pyroelectric radiation detectors comprise a plate capacitor, as indicated in FIG. 1 and whose dielectric material 2 is generally a monodomain ferroelectric monocrystal and which is consequently pyroelectric. The faces of the monocrystal in contact with the electrodes 4 of the capacitor are perpendicular to the polar axis N of the monocrystal.

The absorption of the incident radiation, particularly infrared radiation, on the surface or within the dielectric material leads to a temperature rise dT of the detector, which causes a variation $dP_s$ of the spontaneous polarization $P_s$ of the material. This leads to a voltage dV, which is applied to the input of a high impedance amplifier 6, e.g. constituted by a field effect transistor (FET).

Under these conditions of use the pass band-sensitized product increases in size in proportion to the ratio $M = P/\epsilon C$. In this ratio, which appears as a quality factor, p is the pyroelectric coefficient of the dielectric material corresponding to the variation of the spontaneous polarization $P_s$ as a function of the temperature T, i.e.:

$$p = \frac{\delta P_s}{\delta T}$$

$\epsilon$ being the principal dielectric permittivity along the polar axis and C the calorific capacity of the material.

Hitherto an attempt has always been made to maximize the quality factor M either by acting on the chemical nature of the material leading to the exclusive use of ferroelectric materials, or more artificially by using composite structures. Such structures are described in the article appearing in the Journal Ferroelectrics no. 27, 1980, pp. 49 ff., by R. E. NEWNHAM, D. P. SKINNER, K. A. KLICKER, A. S. BHALIA, B. HARDIMAN and T. R. GURURAJA.

Thus, in the first case to obtain a maximum quality factor for a particular usage of a pyroelectric detector, it is necessary to carry out detailed research to determine the most suitable material. In the second case when composite structures are used, the major disadvantage is that it is difficult to obtain homogeneous detectors. This problem is particularly serious in imaging devices and particularly infrared imaging devices.

Moreover, the quality factor of the constituent material of known detectors is dependent on the temperature, so that the performances of these detectors are not stable with respect to operating temperature variations.

BRIEF SUMMARY OF THE INVENTION

The invention relates to a pyroelectric detector making it possible to obtain maximum quality factors and/or quality factors which are as temperature-constant as possible for a given ferroelectric material.

More specifically the invention relates to a pyroelectric detector comprising a dielectric material inserted between two parallel electrodes, the material being a monodomain ferroelectric monocrystal, wherein the faces of the monocrystal in contact with the electrodes are inclined towards the polar axis of the monocrystal.

Thus, contrary to what has hitherto been accepted, it is possible to use a ferroelectric monocrystal having a polar axis inclined relative to the perpendicular of the electrodes of the detector, so that for a given dielectric material it is possible to obtain a higher quality factor than that obtained with a section in said monocrystal perpendicular to the polar axis.

The fact that the polar axis is inclined relative to the perpendicular to the electrodes makes it possible to obtain a further advantage compared with the known detectors. Thus, the variation in the quality factor can be made very small within a wide temperature range.

BRIEF DESCRIPTION OF THE DRAWINGS

The invention is described in greater detail hereinafter relative to non-limitative embodiments and the attached drawings, in which.

DETAILED DESCRIPTION OF THE PREFERRED EMBODIMENTS

Figure 1:
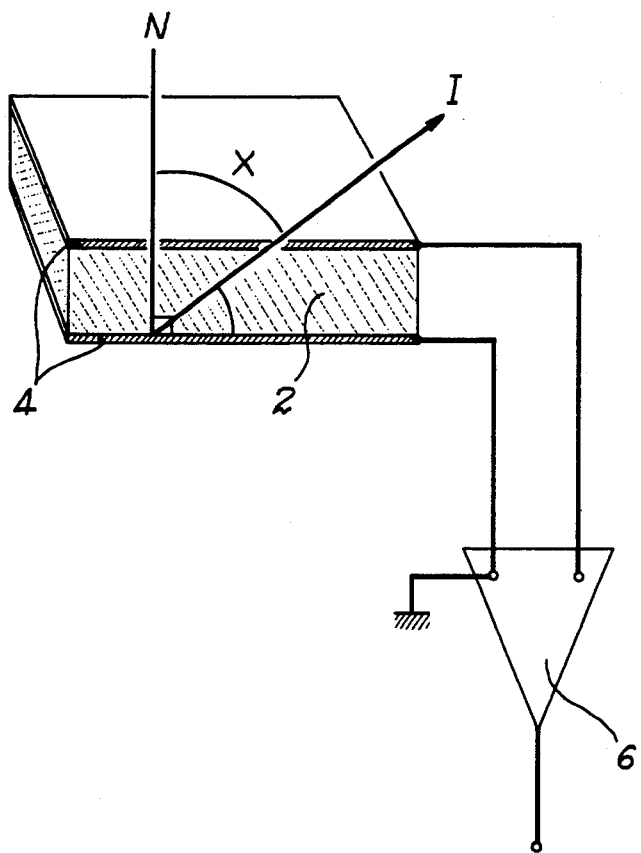
FIG. 1 already described, diagrammatically shows a pyroelectric detector.

The value of the cosine $\gamma$ of angle X, between the polar axis, 1 in FIG. 1, of monocrystal 2 and axis N perpendicular to the faces thereof in contact with the electrodes 4 of the pyroelectric detector, will now be determined in order to maximize the quality factor $M = P/\epsilon C$ of said detector at a given operating temperature.

If $\alpha$, $\beta$ and $\gamma$ are the direction cosines of the considered orientation with respect to the rectangular axes 1, 2 and 3 of the dielectric material, parameters p and $\epsilon$ are expressed in the form:

$$p = \alpha p_1 + \beta p_2 + \gamma p_3$$

in which $p_1$, $p_2$ and $p_3$ are pyroelectric coefficients along axes 1, 2 and 3, and $$\epsilon = \alpha^2 \epsilon_1 + \beta^2 \epsilon_2 + \gamma^2 \epsilon_3 + 2\alpha\beta\epsilon_6 + 2\alpha\beta\epsilon_5 + 2\alpha\beta\epsilon_4$$

in which $_1 \ldots _6$ are the components of the dielectric permittivity tensor in the axis system 1, 2 and 3.

The calorific capacity C of the pyroelectric material is independent of the orientation in question.

If the polar axis coincides with one of the axes, e.g. axis 3, assumed to be invariable with temperature, and 1, 2 and 3 are the major axes of the permittivity tensor, we obtain:

$$p_1 = p_2 = 0 \text{ and}$$

$$\epsilon_4 = \epsilon_5 = \epsilon_6 = 0$$

Moreover, on arranging the dielectric permittivities along the major axes 1, 2 and 3 in increasing order, this will necessarily show $\epsilon_1$ and $\epsilon_3$ as respectively being the principal minimum and maximum dielectric permittivities. This condition is generally satisfied in conventional ferroelectric materials. The anisotropy ratio can then be defined:

$$A = \epsilon_1/\epsilon_3$$

From the various expressions and conditions given hereinbefore, it can be gathered that the quality factor M is governed by equation (1):

$$M = \frac{P}{\epsilon C} = \frac{p_3}{\epsilon_3 C} \frac{\gamma}{\gamma^2(1-A) + A} \quad (1)$$

Therefore, if $M_3$ represents the quality factor for a section of the monocrystal made perpendicular to the polar axis, we obtain:

$$\frac{M}{M_3} = \frac{\gamma}{\gamma^2(1-A) + A}$$

At fixed temperature both parameter A and $M_3$ are given, so that the ratio $M/M_3$ has a maximum for:

$$\gamma = \left(\frac{A}{1-A}\right)^{\frac{1}{2}}$$

provided that $A \leq \frac{1}{2}$, $\gamma$ being such that $0 < \gamma \leq 1$.

This maximum $(M/M_3)_{max}$ is equal to:

$$\frac{1}{2[A(1-A)]^{\frac{1}{2}}}$$

Figure 2:
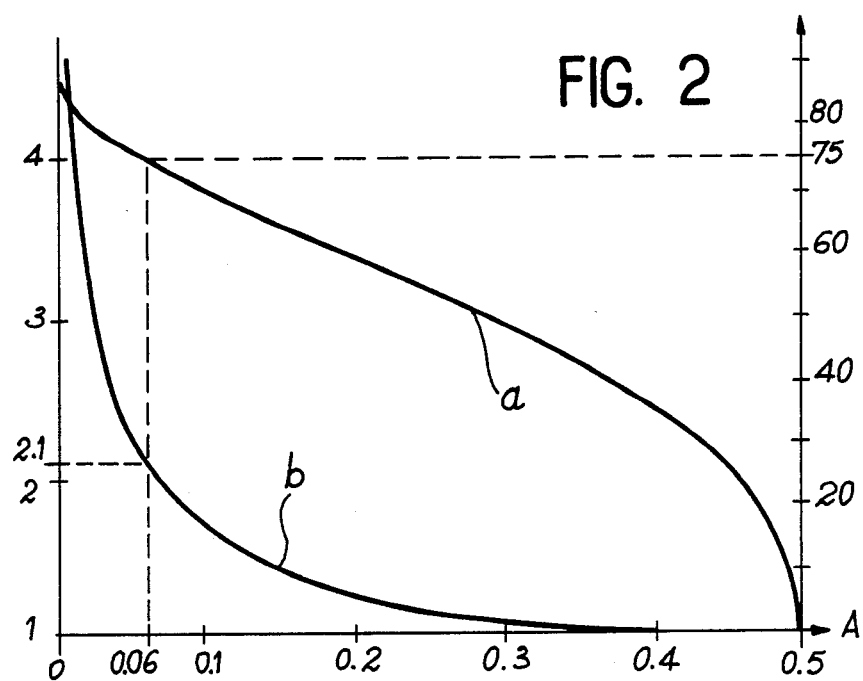
FIG. 2 diagrammatically shows the variations of the optimum angle (in degrees) and the gain on the quality factor, as a function of the anisotropy ratio A for a fixed working temperature.

FIG. 2 simultaneously gives the optimum angle, i.e. Arc cos $\gamma$ (curve A) and the corresponding value of the ratio $M/M_3$ (curve b) as a function of the anisotropy ratio A.

As an example, we will consider the case of triglycine sulphate (TGS).

For an operating temperature of 20° C., the anisotropy ratio A is 0.06. According to FIG. 2, the corresponding angle is 75° (curve a) and the ratio $M/M_3$ equal to 2.1 (curve b). Thus, a factor of more than 2 is gained on the quality factor with a section which is greatly inclined with respect to the polar axis.

A limited variation in the quality factor in a wide temperature range makes it possible to produce detectors or imaging systems, whose response depends only slightly on the ambient temperature. Such a result can be obtained with a section inclined towards the polar axis according to the present invention.

The value of the angle which has to be formed by the polar axis of the monocrystal with the faces thereof in contact with the electrodes will now be determined, so as to make the quality factor of the detector independent of the temperature, within a given operating temperature range.

In order to determine this angle it is assumed, as hereinbefore, that the polar axis coincides with the major axis 3 and that the major axes are invariable in the given operating temperature range. Moreover, the principal dielectric permittivity $\epsilon_1$ and the calorific capacity C of the dielectric material are independent of the temperature.

According to the thermodynamic theory of Devonshire (E. FATUZZO, W. J. MERZ, Ferroelectricity, North Holland Publishing Corp, Amsterdam (1967)), the variations of the spontaneous polarization $P_s$ and dielectric permittivity $\epsilon_3$ as a function of temperature for a ferroelectric-paraelectric transition of the second order, are in the form:

$$P_s \sim (T - T_c)^{\frac{1}{2}},$$

and $$\epsilon_3 \sim \frac{1}{T - T_c}$$

in which $T_c$ represents the Curie or transition temperature.

With the pyroelectric coefficient $$p_3 = \frac{\delta P_s}{\delta T}$$

we obtain $p_3 \sim (T - T_c)^{-\frac{1}{2}}$.

On introducing the reduced variable:

$$\tau = \frac{P_s(T)}{P_s(O)} \leq 1$$

in which O designates the minimum operating temperature and T the temperature under consideration, we obtain:

$$p_3 \sim P_s^{-1} \frac{1}{\tau},$$

and $$\epsilon_3 \sim P_s^{-2} \sim \frac{1}{\tau^2}$$

From this the following expression is deduced:

$$\frac{p_3}{\epsilon_3} \sim \tau \quad (2)$$

Moreover, as the principal dielectric permittivity $\epsilon_1$ is independent of the temperature, the anisotropy parameter $A = \epsilon^1/\epsilon^3$ varies as $$A = \frac{1}{\epsilon_3} \sim \tau^2. \quad (3)$$

By introducing expressions (2) and (3) into equation (1), after simplification, we obtain equation (4):

$$\frac{M_T}{M_{30}} = \frac{1/\gamma}{A_o\left(\frac{1}{\gamma^2} - 1\right)\tau + \frac{1}{\tau}} \quad (4)$$

In equation (4) only the reduced spontaneous polarization terms $\tau$ depends on the temperature. The ratio $M_T/M_{30}$ is minimal in a wide range of $\tau$ for $A_o(1/\gamma_2 - 1)$ differing little from 1.5.

The following table shows that for $A_o(1/\gamma_2-1)=1.5$, the term $B=A_o(1/\gamma^2-1)\tau+1/\tau$ varies by no more than 2% in the range $0.6<\tau<1$, and this is around a mean value of approximately 2.5.

| $\tau$ | 1 | 0.8 | 0.6 |
|---|---|---|---|
| B | 2.5 | 2.45 | 2.56 |

Thus, for a given material, it is possible to define the temperature range in which there will be a small variation of the quality factor. This range is defined on the basis of the minimum and maximum operating temperatures and the maximum temperature can be defined on the basis of the equation $P_s(T)=0.6\, P_s(0)$.

Thus, the equation $A_o(1/\gamma^2-1)=1.5$ defines a section of the monocrystal with minimum thermal drift of the quality factor M. From this equation it is possible to derive equation (5):

$$\gamma = \left(\frac{A_o}{A_o + 1.5}\right)^{\frac{1}{2}} \quad (5)$$

Figure 3:
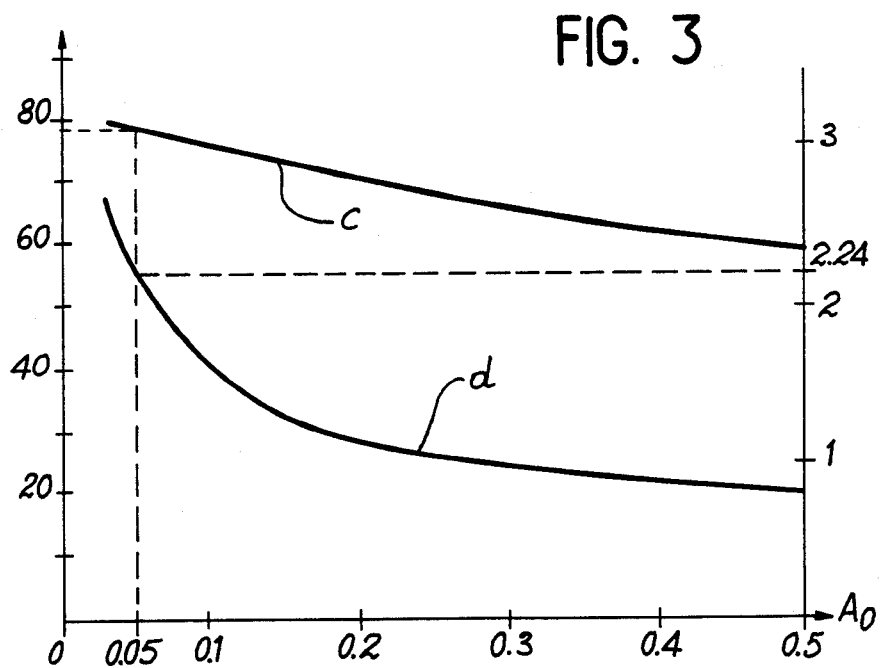
FIG. 3 diagrammatically shows the variations of the angle (in degrees) minimizing thermal drifts of the quality factor and the thermal variations thereof, as a function of the anisotropy ratio $A_o$ at the minimum working temperature.

The angle minimizing the thermal variations of the quality factor $P/\epsilon C$ in accordance with expression (4) is shown in FIG. 3 (curve c) as a function of the anisotropic ratio at the minimum operating temperature $A_o$. The corresponding ratio $M_T/M_{30}$ (curve d) is also shown therein. It should be noted that for small values of $A_o$, the section of the monocrystal minimizing the thermal drifts of the quality factor also gives a significant gain on the value of said factor at the minimum operating temperature. For example if $A_o$ is 0.05, it can be deduced therefrom on the basis of curve d that the ratio $M_T/M_{30}$ is equal to 2.24 and the corresponding angle given by curve c is 79.5°.

The above hypotheses make it possible to determine the optimum determination angle. It may be possible to improve the optimum value of $\gamma$ by directly measuring the thermal variation of the quality factor for inclinations close to those determined by equation (5).

The invention has the advantage of making it possible to optimize the quality factor of the pyroelectric detector as a function of its use, the invention being applicable to any detector with a conventional ferroelectric material (essentially TGS).

What is claimed is:

1. A pyroelectric detector with an optimized quality factor, comprising a dielectric material inserted between two parallel electrodes of a class other than (1) and m, the material being a monodomain ferroelectric monocrystal, the faces of the monocrystal in contact with the electrodes being inclined towards the polar axis of the monocrystal, the quality factor being the ratio $p/\epsilon C$, in which p is the pyroelectric coefficient of the dielectric material of the detector, $\epsilon$ is the principal dielectric permittivity along the polar axis of the material and C is the calorific capacity of the material, the perpendicular line to the faces of the monocrystal in contact with the electrodes being substantially contained in the plane of the major axes 1 and 3 and the angle X between said perpendicular line and the polar axis of the monocrystal being determined as a function of a parameter A equal to $\epsilon_1/\epsilon_3$, $\epsilon_1$ and $\epsilon_3$ respectively representing the minimum major dielectric permittivities of the dielectric material and respectively corresponding to major axes 1 and 3.

2. A pyroelectric detector according to claim 1, wherein the angle X is such that the quality factor of the detector is substantially independent of the temperature in a given operating temperature range.

3. A pyroelectric detector according to claim 1, wherein the cosine $\gamma$ of angle X is close to $$\left(\frac{A_o}{A_o + 1.5}\right)^{\frac{1}{2}},$$

$A_o$ representing the value of parameter A at the minimum operating temperature.

4. A pyroelectric detector according to claim 1, wherein parameter A is below 0.1.

5. A pyroelectric detector according to claim 1, wherein the angle X is such that the quality factor of the detector is essentially at a maximum level for a given working temperature, wherein parameter A is below 0.5, and wherein cosine $\gamma$ of angle X is close to $(A/1-A)^{\frac{1}{2}}$.

6. A pyroelectric detector according to claim 5, wherein said material is triglycine sulphate and angle X is close to 75°.

* * * * *